US012385139B2

(12) United States Patent
Hara et al.

(10) Patent No.: US 12,385,139 B2
(45) Date of Patent: Aug. 12, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Daisuke Hara, Toyama (JP); Takashi Yahata, Toyama (JP); Kenji Shinozaki, Toyama (JP); Kazuhiko Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 988 days.

(21) Appl. No.: 17/012,867

(22) Filed: Sep. 4, 2020

(65) Prior Publication Data
US 2020/0399757 A1 Dec. 24, 2020

Related U.S. Application Data

(63) Continuation of application No. PCT/JP2019/009657, filed on Mar. 11, 2019.

(30) Foreign Application Priority Data

Mar. 22, 2018 (JP) ................. 2018-054663

(51) Int. Cl.
C23C 16/52 (2006.01)
C23C 16/455 (2006.01)
(Continued)

(52) U.S. Cl.
CPC ........ C23C 16/52 (2013.01); C23C 16/45525 (2013.01); C23C 16/45557 (2013.01); H01L 21/0228 (2013.01); H01L 21/67017 (2013.01)

(58) Field of Classification Search
CPC .. C23C 16/452; C23C 16/45561; C23C 16/52
See application file for complete search history.

(56) References Cited

U.S. PATENT DOCUMENTS

2009/0266296 A1* 10/2009 Tachibana ........... C23C 16/4485
118/715
2011/0100483 A1* 5/2011 Nagata .................. F02D 19/027
137/334
(Continued)

FOREIGN PATENT DOCUMENTS

JP 2006-222265 A 8/2006
JP 2011-216906 A 10/2011
(Continued)

OTHER PUBLICATIONS

Office Action in corresponding Japanese Patent Application No. 2020-508222, dated Mar. 19, 2021, with English translation.
(Continued)

Primary Examiner — Joseph A Miller, Jr.
(74) Attorney, Agent, or Firm — Edell, Shapiro & Finnan, LLC

(57) ABSTRACT

According to one aspect of the technique, there is provided a substrate processing apparatus including: a process chamber in which a substrate is processed; a first gas supply system configured to supply a first gas onto the substrate in the process chamber and including a plurality of tanks configured to store the first gas, wherein the first gas is heated in the plurality of the tanks; and a controller configured to control the first gas supply system such that the first gas is supplied onto the substrate in the process chamber while switching among the plurality of the tanks.

15 Claims, 9 Drawing Sheets

(51) Int. Cl.
    *H01L 21/02*     (2006.01)
    *H01L 21/67*     (2006.01)

(56) References Cited

U.S. PATENT DOCUMENTS

2012/0100722 A1* 4/2012 Asai .................... H01L 21/0337
                                                      438/758
2015/0170909 A1* 6/2015 Sato .................. H01L 21/02274
                                                      438/778

FOREIGN PATENT DOCUMENTS

| JP | 2014-209633 | A | 11/2014 |
| JP | 2015-073021 | A | 4/2015 |
| JP | 2016-216787 | A | 12/2016 |
| KR | 10-1161020 | B1 | 6/2012 |

OTHER PUBLICATIONS

Request for the Submission of an Opinion with English translation in Korean Application No. 10-2024-7002939, dated Mar. 27, 2025, 11 pages.

\* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2019/009657, filed on Mar. 11, 2019, which claims priority under 35 U.S.C. § 119 to Application No. JP 2018-054663 filed on Mar. 22, 2018, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

As one of manufacturing processes of a semiconductor device, a substrate processing may be performed. According to the substrate processing, various films such as an insulating film, a semiconductor film and a conductor film may be formed on a substrate or may be removed from the substrate by loading (transferring) the substrate into a process chamber of a substrate processing apparatus, and activating a gas such as a source gas and a reactive gas supplied into the substrate by activating the gas using plasma.

However, a saturated vapor pressure of the gas such as the source gas and the reactive gas is low, and a pressure of the gas supplied into the process chamber of the substrate processing apparatus may also be low. Therefore, a large flow rate may not be feasible by a flow rate controller configured to adjust a flow rate of the gas, and it may be difficult to improve a film-forming rate and a film quality.

SUMMARY

Described herein is a technique capable of uniformly processing a substrate.

According to one aspect of the technique of the present disclosure, there is provided a processing apparatus including: a process chamber in which a substrate is processed; a first gas supply system configured to supply a first gas onto the substrate in the process chamber and including a plurality of tanks configured to store the first gas, wherein the first gas is heated in the plurality of the tanks; and a controller configured to control the first gas supply system such that the first gas is supplied onto the substrate in the process chamber while switching among the plurality of the tanks.

DETAILED DESCRIPTION

Hereinafter, one or more embodiments (also simply referred to as "embodiments") according to the technique of the present disclosure will be described.

EMBODIMENT

Hereinafter, an embodiment according to the technique of the present disclosure will be described with reference to FIGS. 1 through 7.
(1) Configuration of Substrate Processing Apparatus (Heating Apparatus)

Figure 1:
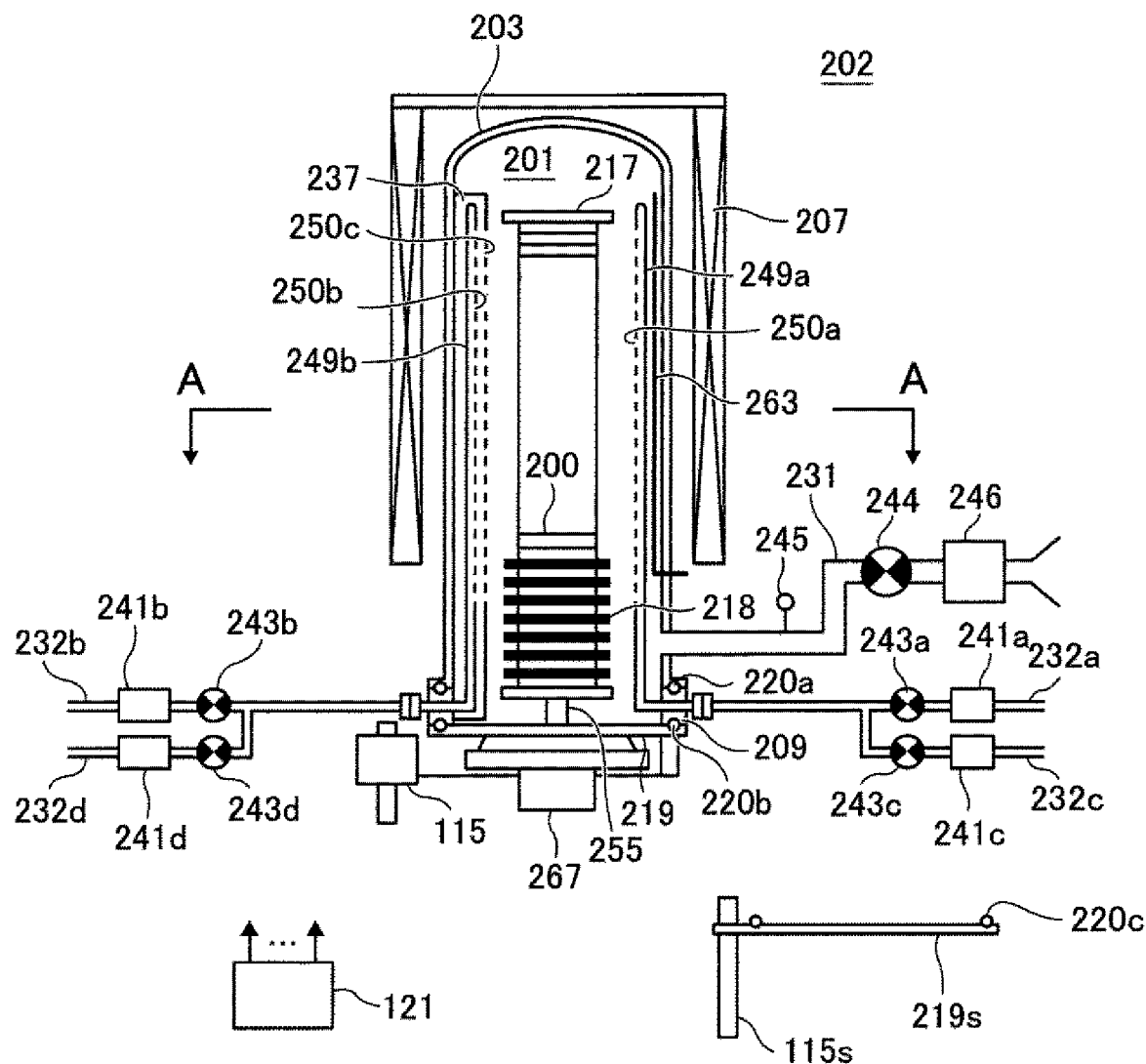
FIG. 1 schematically illustrates a vertical cross-section of a vertical type process furnace of a substrate processing apparatus according to one or more embodiment described herein.

As shown in FIG. 1, for example, a substrate processing apparatus according to the embodiment includes a vertical type process furnace (also simply referred to as a "process furnace") 202 capable of accommodating a plurality of substrates in a multistage manner in a vertical direction. The process furnace 202 includes a heater 207 serving as a heating apparatus (heating mechanism). The heater 207 is of a cylindrical shape, and is vertically installed while being supported by a heater base (not shown) serving as a support plate. As described later, the heater 207 also functions as an activator (which is an activation mechanism) or an exciter (which is an excitation mechanism) capable of activating (or exciting) a gas such as a source gas and a reactive gas by heat.

Process Chamber

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold (which is an inlet flange) 209 is provided under the reaction tube 203 to be aligned in a manner concentric with the reaction tube 203. The manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. As the manifold 209 is supported by the heater base (not shown), the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate the plurality of the wafers including a wafer 200 serving as a substrate. The process vessel is not limited to the configuration described above. For example, only by the reaction tube 203 may be referred to as the process vessel.

Nozzles 249a and 249b are provided in the process chamber 201 so as to penetrate a side wall of the manifold 209. Gas supply pipes 232a and 232b are connected to the nozzles 249a and 249b, respectively.

Mass flow controllers 241a and 241b serving as flow rate controllers (flow rate control devices) and valves 243a and 243b serving as opening/closing valves are sequentially installed at the gas supply pipes 232a and 232b, respectively, from upstream sides to downstream sides of the gas supply pipes 232a and 232b. Hereinafter, a mass flow controller is also referred to as an "MFC". Gas supply pipes 232c and 232d configured to supply an inert gas are connected to the gas supply pipes 232a and 232b at downstream sides of the valves 243a and 243b of the gas supply pipes 232a and 232b, respectively. MFCs 241c and 241d and valves 243c and 243d are sequentially installed at the gas supply pipes 232c and 232d, respectively, from upstream sides to downstream sides of the gas supply pipes 232c and 232d.

Figure 7:
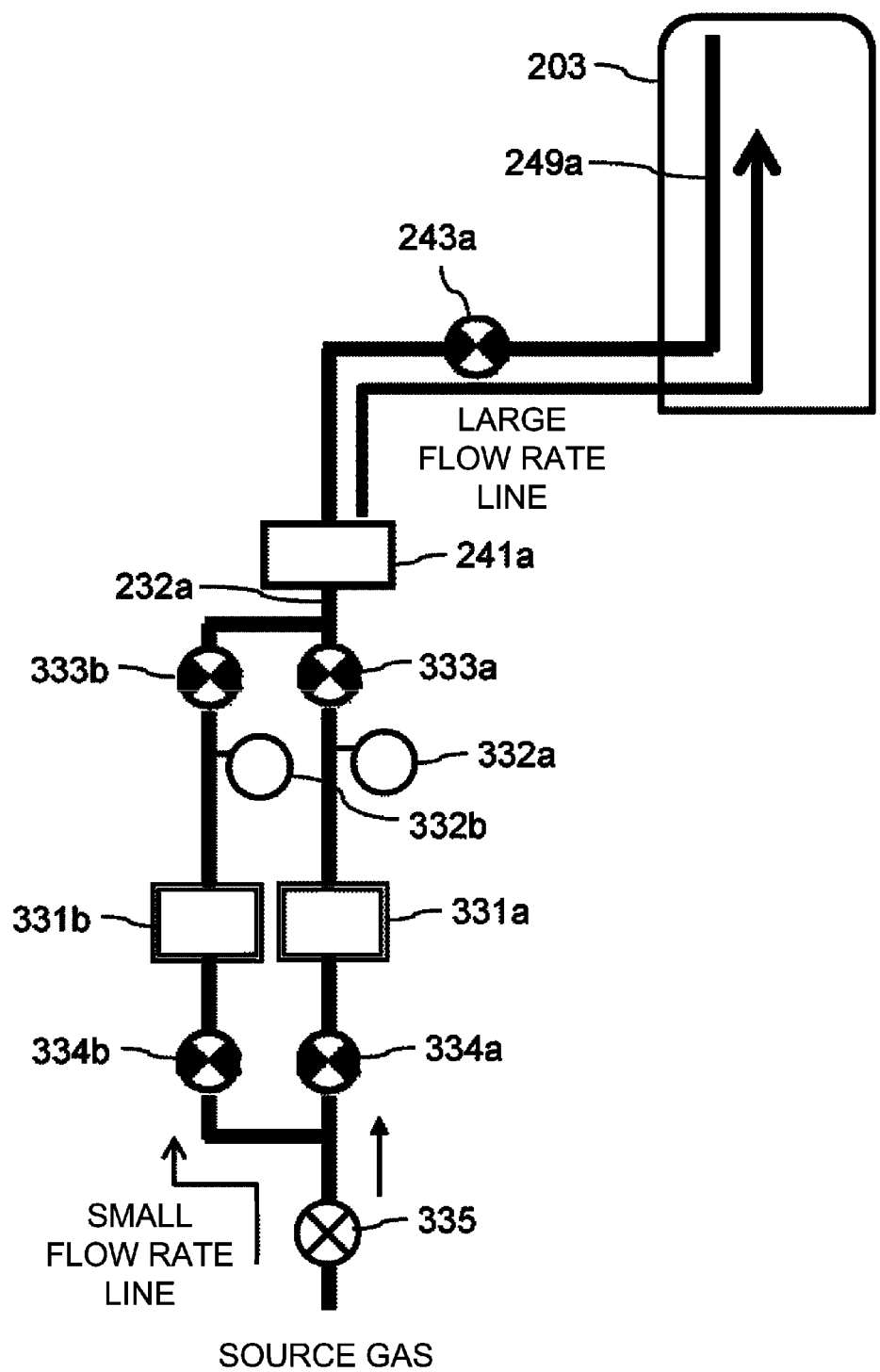
FIG. 7 schematically illustrates a configuration of a source gas supply line of the substrate processing apparatus according to the embodiments described herein.

As shown in FIG. 7, a first tank 331a, a second tank 331b, a first pressure meter 332a configured to measure an inner pressure of the first tank 331a, a second pressure meter 332b configured to measure an inner pressure of the second tank 331b, a first valve 333a configured to control a gas supply from the first tank 331a to the MFC 241a via the gas supply pipe 232a and a second valve 333b configured to control the gas supply from the second tank 331b to the MFC 241a via the gas supply pipe 232a are provided at the upstream side of the gas supply pipe 232a. A first air-operated valve 334a configured to control the gas supply from a pressure regulator 335 to the first tank 331a is provided at an upstream side of the first tank 331a, and a second air-operated valve 334b configured to control the gas supply from the pressure regulator 335 to the second tank 331b is provided at an upstream side of the second tank 331b. The second air-operated valve 334b, the second tank 331b, the second pressure meter 332b and the second valve 333b are provided as a small flow rate line configured to supply a small amount of the source gas. A volume of the first tank 331a is the same as that of the second tank 331b. However, the volume of the first tank 331a may be different from that of the second tank 331b.

Figure 2:
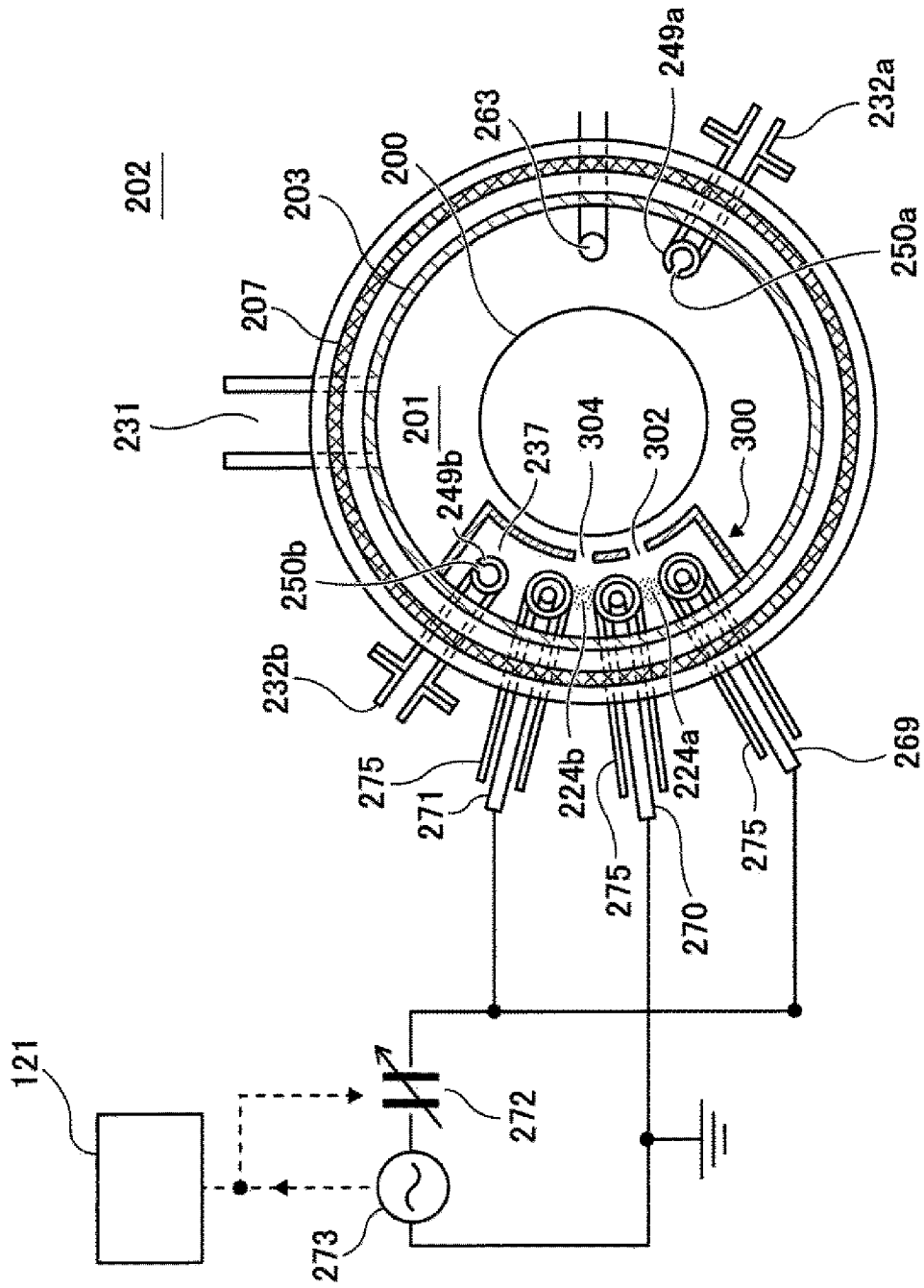
FIG. 2 schematically illustrates a horizontal cross-section taken along the line A-A of the vertical type process furnace of the substrate processing apparatus according to the embodiments shown in FIG. 1.

As shown in FIG. 2, the nozzle 249a is installed in a space between an inner wall of the reaction tube 203 and the plurality of the wafers including the wafer 200 accommodated in the process chamber 201, and extends from a lower portion of the inner wall of the reaction tube 203 to an upper portion of the inner wall of the reaction tube 203 along a stacking direction of the plurality of the wafers. That is, the nozzle 249a is provided in a region that horizontally surrounds a wafer arrangement region where the plurality of the wafers are arranged along the stacking direction of the plurality of the wafers. That is, the nozzle 249a is provided at edges (peripheral portions) of the plurality of the wafers accommodated in the process chamber 201. In other words, the nozzle 249a is provided perpendicularly to surfaces (flat surfaces) of the plurality of the wafers. A plurality of gas supply holes 250a configured to supply the gas are provided at a side surface of the nozzle 249a. The plurality of the gas supply holes 250a are open toward a center of the reaction tube 203, and are configured to supply the gas toward the plurality of the wafers accommodated in the process chamber 201. The plurality of the gas supply holes 250a are provided from a lower portion the reaction tube 203 to an upper portion of the reaction tube 203. The opening areas of the gas supply holes 250a are equal to one another, and the gas supply holes 250a are arranged at the same pitch.

Figure 3A:
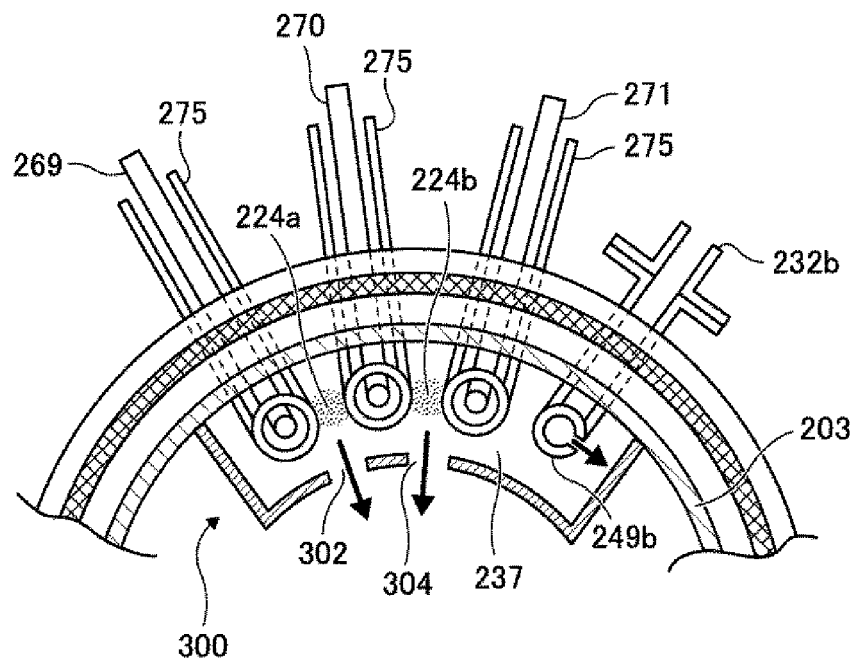
FIG. 3A is an enlarged cross-sectional view for explaining a buffer structure of the substrate processing apparatus according to the embodiments described herein.
Figure 3B:
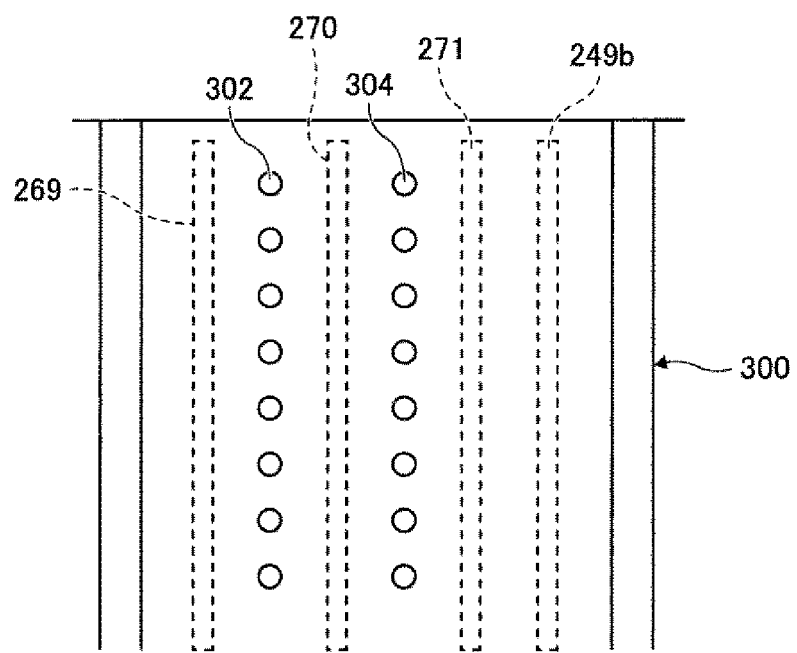
FIG. 3B is a schematic diagram for explaining the buffer structure of the substrate processing apparatus according to the embodiments described herein.

The nozzle 249b is connected to a front end of the gas supply pipe 232b. As shown in FIG. 2, the nozzle 249b is provided in a buffer chamber 237 serving as a gas dispersion space. As shown in FIG. 2, the buffer chamber 237 is installed in an annular space between the inner wall of the reaction tube 203 and the plurality of the wafers including the wafer 200 accommodated in the process chamber 201 when viewed from above, and extends from the lower portion of the inner wall of the reaction tube 203 to the upper portion of the inner wall of the reaction tube 203 along the stacking direction of the plurality of the wafers. That is, the buffer chamber 237 is defined by a buffer structure 300 provided in a region that horizontally surrounds the wafer arrangement region where the plurality of the wafers are arranged along the stacking direction of the plurality of the wafers. The buffer structure 300 is made of an insulating material which is a heat resistant material such as quartz and SiC. A plurality of gas supply ports 302 and a plurality of gas supply ports 304, which are configured to supply the gas, are provided on an arc-shaped wall surface of the buffer structure 300. As shown in FIGS. 2 and 3, the plurality of the gas supply ports 302 and the plurality of the gas supply ports 304 are provided to face a plasma generation region 224a between rod-shaped electrodes 269 and 270 described later and a plasma generation region 224b between rod-shaped electrodes 270 and 271 described later, respectively. The plurality of the gas supply ports 302 and the plurality of the gas supply ports 304 are open toward the center of the reaction tube 203 to supply the gas toward the plurality of the wafers accommodated in the process chamber 201. The plurality of the gas supply ports 302 and the plurality of the gas supply ports 304 are provided from the lower portion the reaction tube 203 to the upper portion of the reaction tube 203. The opening areas of the gas supply ports 302 are equal to one another, and the gas supply ports 302 are provided at the same pitch. The opening areas of the gas supply ports 304 are equal to one another, and the gas supply ports 304 are arranged at the same pitch.

The nozzle 249b extends from the lower portion of the inner wall of the reaction tube 203 to the upper portion of the inner wall of the reaction tube 203 along the stacking direction of the plurality of the wafers including the wafer 200. That is, the nozzle 249b is provided in the buffer structure 300 and in the region that horizontally surrounds the wafer arrangement region where the plurality of the wafers are arranged along the stacking direction of the plurality of the wafers. That is, the nozzle 249b is provided at the edges (the peripheral portions) of the plurality of the wafers accommodated in the process chamber 201. In other words, the nozzle 249b is provided perpendicularly to the surfaces (the flat surfaces) of the plurality of the wafers. A plurality of gas supply holes 250b configured to supply the gas are provided at a side surface of the nozzle 249b. The plurality of the gas supply holes 250b are open toward a wall surface of the buffer structure 300 provided along a radial direction with respect to the arc-shaped wall surface of the buffer structure 300, and are configured to supply the gas toward the wall surface of the buffer structure 300. As a result, the reactive gas is dispersed (diffused) in the buffer chamber 237, and is not directly sprayed onto the rod-shaped electrodes 269 through 271. Therefore, it is possible to suppress the generation of particles. Similar to the plurality of the gas supply holes 250a, the plurality of the gas supply holes 250b are provided from the lower part to the upper part of the reaction tube 203. The opening areas of the gas supply holes 250b are equal to one another, and the gas supply holes 250b are arranged at the same pitch.

According to the present embodiment, the gas such as the source gas and the reactive gas are supplied through the nozzles 249a and 249b and the buffer chamber 237, which are provided in the vertical annular space (that is, a cylindrical space) defined by an inner surface of a side wall (that is, the inner wall) of the reaction tube 203 and the edges (peripheral portions) of the plurality of the wafers including the wafer 200 arranged in the reaction tube 203. Then, the gas is ejected into the reaction tube 203 in the vicinity of the plurality of the wafers through the plurality of the gas supply holes 250a and the plurality of the gas supply holes 250b of the nozzles 249a and 249b, respectively, and the plurality of the gas supply ports 302 and the plurality of the gas supply ports 304 of the buffer chamber 237. The gas ejected into the reaction tube 203 mainly flows parallel to the surfaces of the plurality of the wafers, that is, in a horizontal direction. Thereby, it is possible to uniformly supply the gas to each of the plurality of the wafers and to form a film with a uniform thickness on the plurality of the wafers. After passing the surfaces of the plurality of the wafers, the gas flows toward an exhaust port, that is, toward an exhaust pipe 231 described later. However, a flow direction of the gas may vary depending on the location of the exhaust port, and is not limited to the vertical direction.

The source gas containing a predetermined element is supplied into the process chamber 201 through the gas supply pipe 232a provided with the MFC 241a and the valve 243a and the nozzle 249a. The source gas may also be referred to as a "first gas". For example, a silane source gas containing silicon (Si) as the predetermined element may be used as the source gas.

In the present specification, the term "source gas" may refer to a source material in a gaseous state under the normal temperature and the normal pressure (atmospheric pressure) or a gas obtained by vaporizing a source material in a liquid state (that is, a liquid source) under the normal temperature and the normal pressure. In the present specification, the term "source material" may indicate only "source material in a liquid state", may indicate only "source material (source gas) in a gaseous state" and may indicate both of "source material in the liquid state" and "source material in the gaseous state".

A source gas containing silicon (Si) and a halogen element, that is, a halosilane source gas may be used as the silane source gas. A halosilane source material refers to a silane source material containing a halogen group. The halogen group includes at least one halogen element selected from the group consisting of chlorine (Cl), fluorine (F), bromine (Br) and iodine (I). That is, the halosilane source material may include at least one halogen group selected from the group consisting of a chloro group, a fluoro group, a bromo group and an iodo group. The halosilane source material may be considered as a halide.

For example, a source gas containing silicon (Si) and chlorine (Cl), that is, a chlorosilane source gas may be used as the halosilane source gas. For example, dichlorosilane ($SiH_2Cl_2$, abbreviated to DCS) gas may be used as the chlorosilane source gas.

The reactive gas serving as a reactant containing an element different from the predetermined element is supplied into the process chamber 201 through the gas supply pipe 232b provided with the MFC 241b and the valve 243b and the nozzle 249b. The reactive gas may also be referred to as a "second gas". For example, a nitrogen (N)-containing gas may be used as the reactive gas. As the nitrogen-containing gas, for example, a hydrogen nitride-based gas may be used. The hydrogen nitride-based gas may also be referred to as a substance constituted by two elements of nitrogen (N) and hydrogen (H) without any other elements. The hydrogen nitride-based gas serves as a nitriding gas, that is, a nitrogen source material. For example, ammonia ($NH_3$) gas may be used as the hydrogen nitride-based gas.

The inert gas such as nitrogen ($N_2$) gas is supplied into the process chamber 201 through the gas supply pipes 232c and 232d provided with the MFCs 241c and 241d and the valves 243c and 243d, respectively, the gas supply pipes 232a and 232b and the nozzles 249a and 249b.

For example, a source gas supply system serving as a first gas supply system is constituted mainly by the gas supply pipe 232a, the MFC 241a, the valve 243a, and a reactive gas supply system (which is a reactant supply system) serving as a second gas supply system is constituted mainly by the gas supply pipe 232b, the MFC 241b and the valve 243b. An inert gas supply system is constituted mainly by the gas supply pipes 232c and 232d, the MFCs 241c and 241d and the valves 243c and 243d. The source gas supply system, the reactive gas supply system and the inert gas supply system may be collectively referred to as a gas supply system (or a gas supplier).

Plasma Generator

As illustrated in FIGS. 2 and 3, in the buffer chamber 237, three rod-shaped electrodes 269, 270 and 271 made of a conductor and formed as an elongated thin and long structure are provided from the lower portion to the upper portion of the reaction tube 203 along the stacking direction of the plurality of the wafers including the wafer 200. Each of the rod-shaped electrodes 269, 270 and 271 is provided parallel to the nozzle 249b. Each of the rod-shaped electrodes 269, 270 and 271 is covered and protected by an electrode protecting pipe 275 from an upper portion to a lower portion thereof. The rod-shaped electrode 270 is connected to and grounded to the electrical ground serving as a reference potential, and the two rod-shaped electrodes 269 and 271 of the three rod-shaped electrodes 269, 270 and 271 disposed at both sides of the rod-shaped electrode 270 are connected to a high frequency power supply 273 through a matcher 272 (which is a matching mechanism). That is, the rod-shaped electrodes 269 and 271 connected to the high frequency power supply 273 and the rod-shaped electrode 270 connected to the electrical ground are alternately arranged, and the rod-shaped electrode 270 provided between the rod-shaped electrodes 269 and 271 serves as a common ground for the rod-shaped electrodes 269 and 271. In other words, the rod-shaped electrode 270 connected to the electrical ground is disposed between the rod-shaped electrodes 269 and 271, and the rod-shaped electrodes 269 and 270 and the rod-shaped electrodes 271 and 270 respectively form pairs to generate plasma. That is, the grounded rod-shaped electrode 270 is commonly used for the two rod-shaped electrodes 269 and 271 adjacent to the rod-shaped electrode 270 and connected to the high frequency power supply 273. By applying high frequency power (that is, RF power) to the rod-shaped electrodes 269 and 271 from the high frequency power supply 273, the plasma is generated in the plasma generation region 224a between the rod-shaped electrodes 269 and 270 and in the plasma generation region 224b between the rod-shaped electrodes 270 and 271. A plasma generator (which is a plasma generating apparatus) capable of generating the plasma in the plasma generation regions 224a and 224b is constituted mainly by the rod-shaped electrodes 269, 270 and 271, the electrode protecting pipe 275. As described above, three rod-shaped electrodes 269, 270 and 271 are provided from the lower portion to the upper portion of the reaction tube 203 along the stacking direction of the plurality of the wafers including the wafer 200. In other words, the plasma generator provided in the process chamber 201 in the vertical direction. The plasma generator serves as a plasma source. The plasma generator may further include the matcher 272 and the high frequency power supply 273. As described later, the plasma generator (plasma source) also functions as an activator (which is an activation mechanism) or an exciter (which is an excitation mechanism) capable of activating (or exciting) the gas to the plasma (that is, into a plasma state).

The electrode protecting pipe 275 is configured to insert each of the rod-shaped electrodes 269, 270 and 271 into the buffer chamber 237 in a state of being isolated from an inner atmosphere of the buffer chamber 237. If an oxygen concentration of an inside of the electrode protecting pipe 275 is set to the same level as an oxygen concentration of an outside air (an air atmosphere), the rod-shaped electrodes 269, 270 and 271 inserted into the electrode protecting pipe 275 respectively, may be oxidized by the heat of the heater 207. Therefore, by charging the inside of the electrode protecting pipe 275 with the inert gas such as the $N_2$ gas or by purging the inside of the electrode protecting pipe 275 with the inert gas such as the $N_2$ gas using an inert gas purge apparatus, it is possible to lower the oxygen concentration of the inside of the electrode protecting pipe 275 Thereby, it is possible to suppress the oxidation of the rod-shaped electrodes 269, 270 and 271.

The exhaust pipe 231 configured to exhaust an inner atmosphere of the process chamber 201 is provided at the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection device) to detect an inner pressure of the process chamber 201, and the APC valve 244 serves as an exhaust valve (pressure regulator). With the vacuum pump 246 in operation, the APC valve 244 may be opened or closed to vacuum-exhaust the process chamber 201 or stop the vacuum exhaust. With the vacuum pump 246 in operation, an opening degree of the APC valve 244 may be adjusted based on pressure information detected by the pressure sensor 245, in order to control (adjust) the inner pressure of the process chamber 201. An exhaust system is constituted mainly by the exhaust pipe 231, the APC valve 244 and the pressure sensor 245. The exhaust system may further include the vacuum pump 246. The present embodiment is not limited to an example in which the exhaust pipe 231 is provided at the reaction tube 203. For example, similar to the nozzles 249a and 249b, the exhaust pipe 231 may be provided at the manifold 209 instead of the reaction tube 203.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is of a disk shape. An O-ring 220b serving as a seal provided on an upper surface of the seal cap 219 so as to be in contact with the lower end of the manifold 209. A rotator 267 configured to rotate a boat 217 described later is provided under the seal cap 219 opposite to the process chamber 201. A rotating shaft 255 of the rotator 267 is connected to the boat 217 through the seal cap 219. As the rotator 267 rotates the boat 217, the plurality of the wafers including the wafer 200 supported by the boat 217 are rotated. A boat elevator 115 serving as an elevator is provided outside the reaction tube 203 vertically. The seal cap 219 may be elevated or lowered in the vertical direction by the boat elevator 115. When the seal cap 219 is elevated or lowered by the boat elevator 115, the boat 217 placed on the seal cap 219 may be transferred (loaded) into the process chamber 201 or transferred (unloaded) out of the process chamber 201. The boat elevator 115 serves as a transfer device (or a transport device) capable of loading the boat 217 (that is, the plurality of the wafers including the wafer 200 accommodated in the boat 217) into the process chamber 201 or unloading the boat 217 (that is, the plurality of the wafers including the wafer 200 accommodated in the boat 217) out of the process chamber 201. A shutter 219s serving as a furnace opening lid capable of airtightly sealing the lower end opening of the manifold 209 is provided under the manifold 209. The shutter 219s is configured to close the lower end opening of the manifold 209 when the seal cap 219 is lowered by the boat elevator 115. The shutter 219s is made of a metal such as SUS (stainless steel), and of a disk shape. An O-ring 220c serving as a seal is provided on an upper surface of the shutter 219s so as to be in contact with the lower end of the manifold 209. An opening/closing operation of the shutter 219s such as an elevation operation and a rotation operation is controlled by a shutter opener/closer (which is a shutter opening/closing mechanism) 115s.

Substrate Support

As shown in FIG. 1, the boat 217 (which is a substrate support or a substrate retainer) is configured to align the plurality of the wafers including the wafer 200, for example, from 25 to 200 wafers in the vertical direction and configured to support the plurality of the wafers in a multistage manner, while the plurality of the wafers are horizontally oriented with their centers aligned with each other. That is, the boat 217 supports (accommodates) the plurality of the wafers including the wafer 200 with a predetermined interval therebetween. The boat 217 is made of a heat resistant material such as quartz and SiC. Insulating plates 218 are provided under the boat 217 in a multistage manner.

As shown in FIG. 2, a temperature sensor 263 serving as a temperature detector is provided in the reaction tube 203. The state of electric conduction to the heater 207 is adjusted based on temperature information detected by the temperature sensor 263 such that a desired temperature distribution of the inner temperature of the process chamber 201 is obtained. Similar to the nozzles 249a and 249b, the temperature sensor 263 is provided along the inner wall of the reaction tube 203.

Controller

Figure 4:
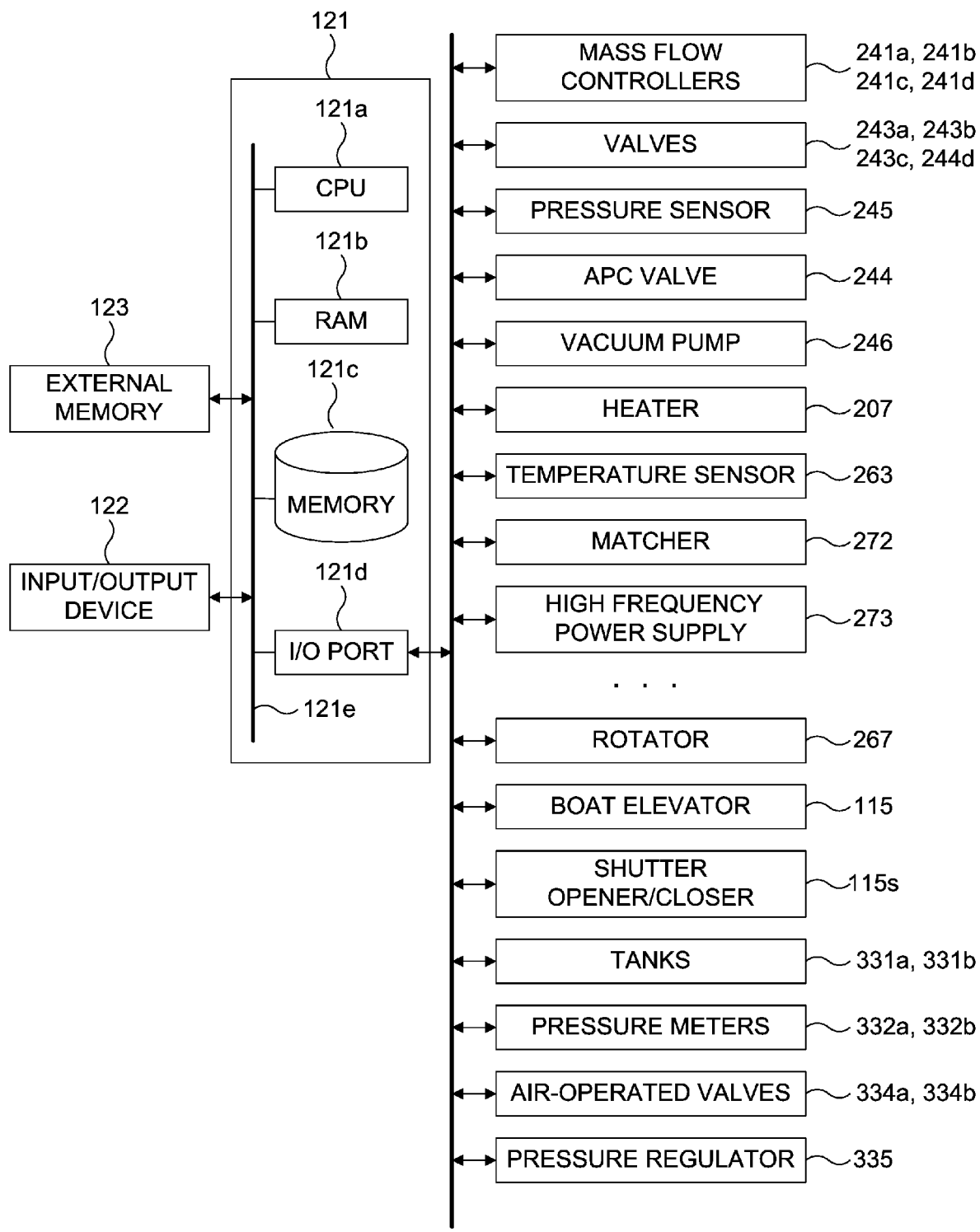
FIG. 4 is a block diagram schematically illustrating a configuration of a controller and related components of the substrate processing apparatus according to the embodiments described herein.

Hereinafter, a controller 121 will be described with reference to FIG. 4. As shown in FIG. 4, the controller 121 serving as a control device (control mechanism) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control the operation of the substrate processing apparatus or a process recipe containing information on the sequences and conditions of a substrate processing such as a film-forming process described later is readably stored in the memory 121c. The process recipe is obtained by combining steps of the film-forming process described later such that the controller 121 can execute the steps to acquire a predetermine result, and functions as a program. Hereafter, the process recipe and the control program may be collectively or individually referred to as a "program". In addition, the process recipe may also be simply referred to as a "recipe". In the present specification, the term "program" may indicate only the process recipe, may indicate only the control program, or may indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 241a, 241b, 241c and 241d, the valves 243a, 243b, 243c and 243d, the pressure sensor 245, the APC valve 244, the vacuum pump 246, the heater 207, the temperature sensor 263, the matcher 272, the rotator 267, the boat elevator 115, the shutter opener/closer 115s, the first tank 331a, the second tank 331b, the first pressure meter 332a, the second pressure meter 332b, the first air-operated valve 334a, the second air-operated valve 334b and the pressure regulator 335.

The CPU 121a is configured to read a control program from the memory 121c and execute the read control program. In addition, the CPU 121a is configured to read a recipe from the memory 121c in accordance with an operation command inputted from the input/output device 122. According to the contents of the read recipe, the CPU 121a may be configured to control various operations such as a control operation of the rotator 267, flow rate adjusting operations for various gases by the MFCs 241a, 241b, 241c and 241d, opening/closing operations of the valves 243a, 243b, 243c and 243d, an operation of adjusting the high frequency power supply 273 based on an impedance monitoring, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, an operation of adjusting a forward/backward rotation, a rotation angle and a rotation speed of the boat 217 by the rotator 267, an elevating and lowering operation of the boat 217 by the boat elevator 115, heating operations of the first tank 331a and the second tank 331b, an opening/closing operation of the first valve 333a based on the first pressure meter 332a, an opening/closing operation of the second valve 333b based on the second pressure meter 332b, opening/closing operations of the first air-operated valve 334a and the second air-operated valve 334b and a pressure adjusting (regulating) operation of the pressure regulator 335.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as MO and a semiconductor memory such as a USB memory and a memory card.

The memory 121c or the external memory 123 may be embodied by a non-transitory computer readable recording medium. Hereafter, the memory 121c and the external memory 123 are collectively referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

(2) Substrate Processing

Figure 5:
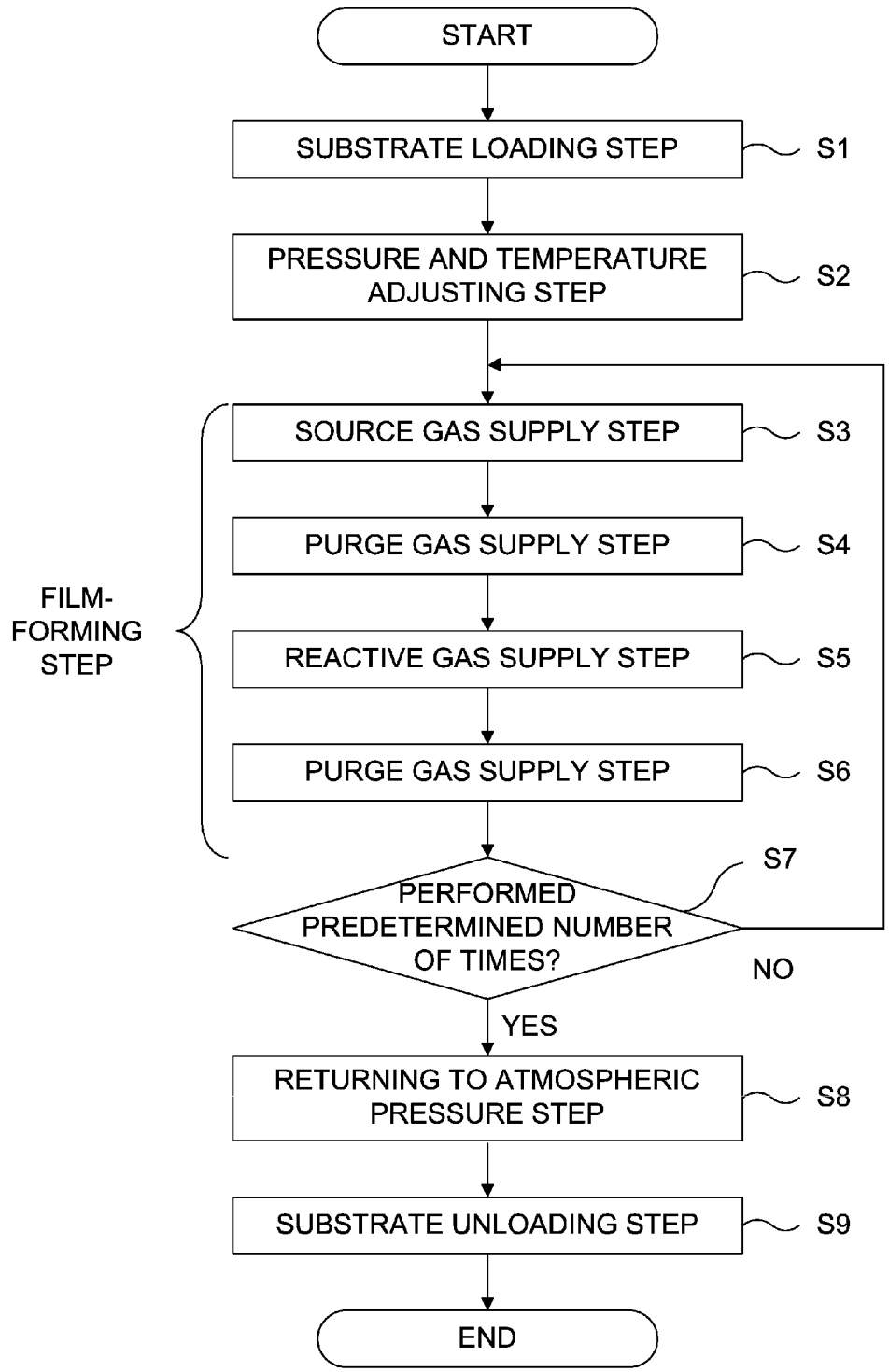
FIG. 5 is a flow chart schematically illustrating a substrate processing according to the embodiments described herein.
Figure 6:
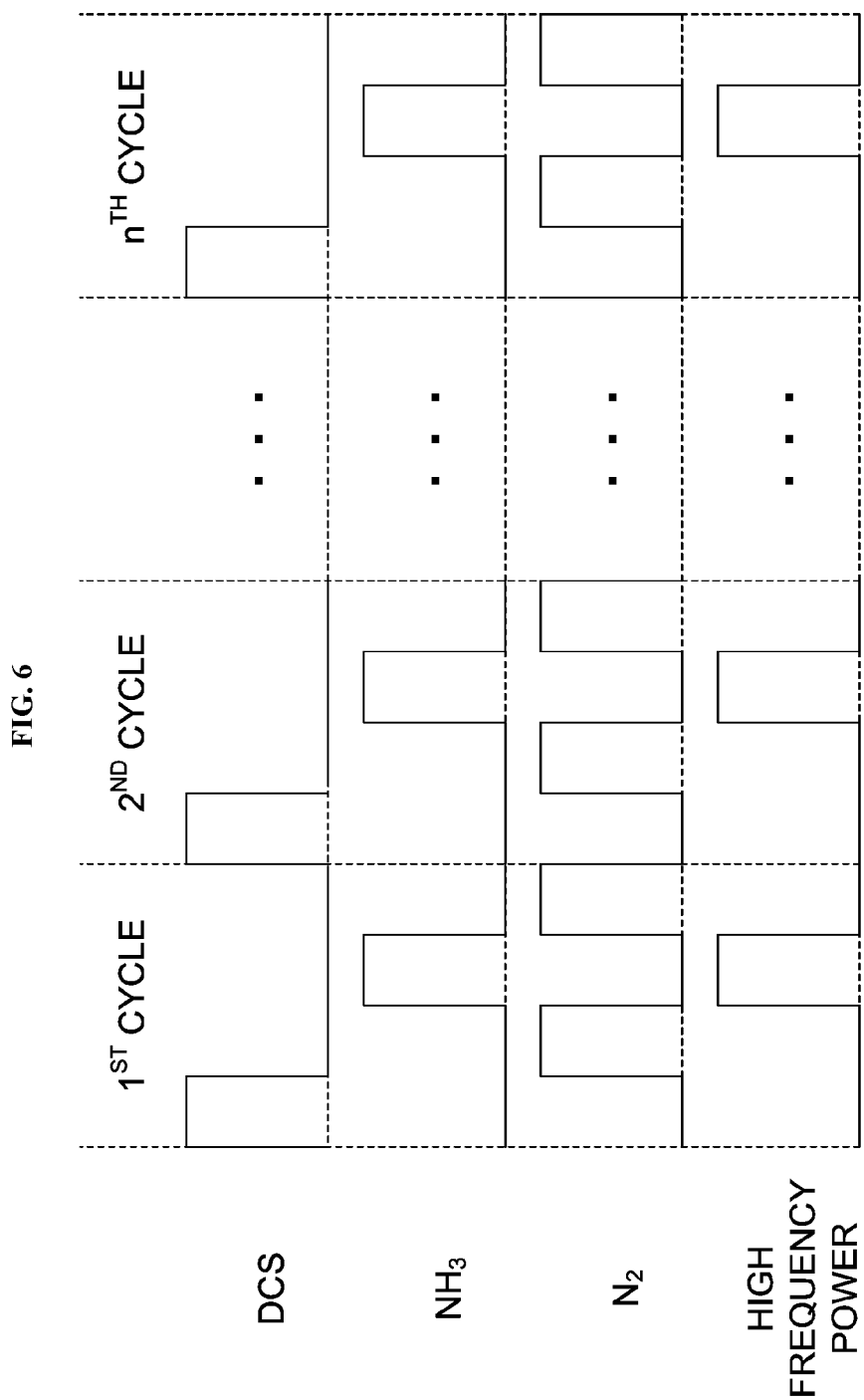
FIG. 6 is a timing diagram schematically illustrating a gas supply used in the substrate processing according to the embodiments described herein.

Hereinafter, the substrate processing (that is, the film-forming process) of forming a film on wafer 200, which is a part of manufacturing processes of a semiconductor device, will be described with reference to FIGS. 5 and 6. Hereinafter, operations of the components constituting the substrate processing apparatus are controlled by the controller 121.

Hereinafter, an example of forming a silicon nitride film (SiN film) containing silicon (Si) and nitrogen (N) on the wafer 200 will be described. The SiN film is formed on the wafer 200 by performing a cycle a predetermined number of times (once or more). The cycle includes a step of supplying the DCS gas serving as the source gas onto the wafer 200 and a step of supplying plasma-excited ammonia ($NH_3$) gas serving as the reactive gas onto the wafer 200. The steps included in each cycle are performed non-simultaneously. A predetermined film may be formed on the wafer 200 in advance. A predetermined pattern may be formed on the wafer 200 or on the predetermined film in advance.

In the present specification, a process flow of the film-forming process shown in FIG. 6 according to the embodiment may be illustrated as follows.

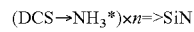

$(DCS \rightarrow NH_3^*) \times n \Rightarrow SiN$

In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or another film formed on a wafer". In the present specification, the term "substrate" and "wafer" may be used as substantially the same meaning. That is, the term "substrate" may be substituted by "wafer" and vice versa.

Substrate Loading Step: S1

The plurality of the wafers including the wafer 200 is charged (transferred) into the boat 217 (wafer charging step). After the boat 217 is charged with the plurality of the wafers, the shutter 219s is moved by the shutter opener/closer 115s to open the lower end opening of the manifold 209 (shutter opening step). Then, as shown in FIG. 1, the boat 217 charged with the plurality of the wafers is elevated by the boat elevator 115 and loaded (transferred) into the process chamber 201 (boat loading step). With the boat 217 loaded, the seal cap 219 seals the lower end opening of the manifold 209 via the O-ring 220b.

Pressure and Temperature Adjusting Step: S2

The vacuum pump 246 vacuum-exhausts the inner atmosphere of the process chamber 201 until the inner pressure of the process chamber 201 in which the plurality of the wafers including the wafer 200 is accommodated reaches a desired pressure (vacuum degree). In the pressure and temperature adjusting step S2, the inner pressure of the process chamber 201 is measured by the pressure sensor 245, and the APC valve 244 is feedback-controlled based on the measured pressure information. The vacuum pump 246 continuously vacuum-exhausts the inner atmosphere of the process chamber 201 until at least a film-forming step of the wafer 200 is completed.

The heater 207 heats the process chamber 201 until the inner temperature of the process chamber 201 reaches a desired temperature. The state of the electric conduction to the heater 207 is feedback-controlled based on the temperature information detected by the temperature sensor 263 such that a desired temperature distribution of the inner temperature of the process chamber 201 is obtained (temperature adjusting step). The heater continuously heats the process chamber 201 until at least the film-forming step of the wafer 200 is completed. However, when the film-forming step is performed at a temperature equal to or lower than the room temperature, the heating of the process chamber 201 by the heater 207 may be omitted. When the film-forming step is performed only at the temperature equal to or lower than the room temperature, the heater 207 may be omitted and the substrate processing apparatus may be implemented without the heater 207. In such a case, it is possible to simplify the configuration of the substrate processing apparatus.

Then, the rotator 267 rotates the plurality of the wafers including the wafer 200 by rotating the boat 217. The rotator 267 continuously rotates the boat 217 and the plurality of the wafers accommodated in the boat 217 until at least the film-forming step of the wafer 200 is completed.

Film-Forming Step

Thereafter, the film-forming step is performed by performing the cycle including a source gas supply step S3 and S4 and a reactive gas supply step S5 and S6.

Source Gas Supply Step: S3 and S4

In a step S3 of the source gas supply step, the DCS gas is supplied onto the wafer 200 in the process chamber 201. The first air-operated valve 334a is opened to fill the first tank 331a with the DCS gas, and the DCS gas in the first tank 331a is heated. The second air-operated valve 334b is opened to fill the second tank 331b with DCS gas, and the DCS gas in the second tank 331b is heated. That is, when the supply of the DCS gas is started in the step S3, both the first tank 331a and the second tank 331b are filled with a predetermined specified amount of the DCS gas and being heated. Then, after a predetermined time has elapsed, the first valve 333a is opened to supply the DCS gas in the first tank 331a to the MFC 241a. When a pressure measured by the first pressure meter 332a reaches a predetermined pressure, the first valve 333a is closed, and the second valve 333b is opened to supply the DCS gas in the second tank 331b to the MFC 241a. In addition, the first air-operated valve 334a is opened to fill the first tank 331a with the DCS gas, and the DCS gas in the first tank 331a is heated. When a pressure measured by the second pressure meter 332b reaches the predetermined pressure, the second valve 333b is closed, and the first valve 333a is opened to supply the DCS gas in the second tank 331b to the MFC 241a. In addition, the second air-operated valve 334b is opened to fill the second tank 331b with the DCS gas, and the DCS gas in the second tank 331b is heated. That is, the DCS gas serving as the source gas is supplied onto the wafer 200 in the process chamber 201 from the first tank 331a and the second tank 331b through the MFC 241a while switching between the first tank 331a and the second tank 331b such that the DCS gas of the predetermined pressure can be supplied to the MFC 241a. By repeatedly performing the operation described above, the DCS gas is supplied to the MFC 241a at a large flow rate.

The valve 243a is opened to supply the DCS gas into the gas supply pipe 232a. After the flow rate of the DCS gas is adjusted by the MFC 241a, the DCS gas whose flow rate is adjusted is supplied into the process chamber 201 through the nozzle 249a and the plurality of the gas supply holes 250a, and is exhausted through the exhaust pipe 231. Simultaneously, the valve 243c may be opened to supply the $N_2$ gas into the gas supply pipe 232c. After the flow rate of the $N_2$ gas is adjusted by the MFC 241c, the $N_2$ gas whose flow rate is adjusted is supplied with the DCS gas into the process chamber 201, and is exhausted through the exhaust pipe 231.

In order to prevent the DCS gas from entering the nozzle 249b, the valve 243d may be opened to supply the $N_2$ gas into the gas supply pipe 232d. The $N_2$ gas is supplied into the process chamber 201 through the gas supply pipe 232b and the nozzle 249b, and is exhausted through the exhaust pipe 231.

For example, a supply flow rate of the DCS gas adjusted by the MFC 241a may range from 1 sccm to 6,000 sccm, preferably from 3,000 sccm to 5,000 sccm. For example, supply flow rates of the $N_2$ gas adjusted by the MFCs 241c and 241d may range from 100 sccm to 10,000 sccm, respectively. For example, the inner pressure of the process chamber 201 may range from 1 Pa to 2,666 Pa, preferably from 665 Pa to 1,333 Pa. For example, a time duration of exposing (supplying) the DCS gas onto the wafer 200 is about 20 seconds per cycle described above. The time duration of exposing the wafer 200 to the DCS gas may vary depending on a thickness of the film.

The temperature of the heater 207 is set (adjusted) such that the temperature of the wafer 200 may range, for example, from 0° C. to 700° C., preferably from the room temperature (25° C.) to 550° C., and more preferably from 40° C. to 500° C. When the temperature of the wafer 200 is maintained at 700° C. or lower, preferably 550° C. or lower, and more preferably 500° C. or lower, it is possible to reduce the heat applied to the wafer 200. Thereby, it is possible to properly control the thermal history of the wafer 200.

By supplying the DCS gas into the process chamber 201 according to the above-described processing conditions, a silicon-containing layer is formed on a top surface (outermost surface) of the wafer 200. The silicon-containing layer may contain carbon (C) and hydrogen (H) in addition to silicon (Si). The silicon-containing layer may be formed by the physical adsorption of the DCS on the top surface of the wafer 200, by the chemical adsorption of substances generated by decomposing a part of the DCS on the top surface of the wafer 200, or by the deposition of silicon generated by the thermal decomposition of the DCS on the top surface of the wafer 200. That is, the silicon-containing layer may be an adsorption layer (a physical adsorption layer or a chemical adsorption layer) of the DCS or the substances generated by decomposing a part of the DCS, or may be a silicon deposition layer (a silicon layer).

After the silicon-containing layer is formed in the step S3, the valve 243a is closed to stop the supply of the DCS gas into the process chamber 201. With the APC valve 244 open, the vacuum pump 246 vacuum-exhausts the inner atmosphere of the process chamber 201 to remove a residual DCS gas or reaction byproducts which did not react or which contributed to the formation of the silicon-containing layer from the process chamber 201 (step S4). By maintaining the valves 243c and 243d open, the $N_2$ gas is continuously supplied into the process chamber 201. $N_2$ gas serves as a purge gas. The step S4 is optional and may be omitted.

While the DCS gas is exemplified as the source gas in the present embodiment, various gases may be used as the source gas. For example, instead of the DCS gas, an aminosilane source gas such as tetrakis(dimethylamino)silane ($Si[N(CH_3)_2]_4$, abbreviated as 4DMAS) gas, tris(dimethylamino)silane ($Si[N(CH_3)_2]_3H$, abbreviated as 3DMAS) gas, bis(dimethylamino)silane ($Si[N(CH_3)_2]_2H_2$, abbreviated as BDMAS) gas and bis(diethylamino)silane ($Si[N(C_2H_5)_2]_2H_2$, abbreviated as BDEAS) gas, bis(tertiarybutylamino)silane gas ($SiH_2[NH(C_4H_9)]_2$, abbreviated as BTBAS), dimethylaminosilane (DMAS) gas, diethylaminosilane (DEAS) gas, dipropylaminosilane (DPAS) gas, diisopropylaminosilane (DIPAS) gas, butylaminosilane (BAS) gas and hexamethyldisilazane (HMDS) gas may be used as the source gas.

Instead of the DCS gas, for example, an inorganic halosilane source gas such as monochlorosilane ($SiH_3Cl$, abbreviated as MCS) gas, trichlorosilane ($SiHCl_3$, abbreviated as TCS) gas, tetrachlorosilane ($SiCl_4$, abbreviated as STC) gas, hexachlorodisilane ($Si_2Cl_6$, abbreviated as HCDS) gas and octachlorotrisilane ($Si_3Cl_8$, abbreviated as OCTS) gas may be used as the source gas. Instead of the DCS gas, for example, an inorganic silane source gas free of halogen such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

While the $N_2$ gas is exemplified as the inert gas in the present embodiment, a rare gas such as argon (Ar) gas, helium (He) gas, neon (Ne) gas and xenon (Xe) gas may be used as the inert gas instead of the $N_2$ gas.

Reactive Gas Supply Step: S5 and S6

After the silicon-containing layer is formed, in the reactive gas supply step, the plasma-excited $NH_3$ gas serving as the reactive gas is supplied onto the wafer 200 in the process chamber 201 (step S5).

In the step S5, the opening and the closing of the valves 243b, 243c and 243d may be controlled in the same manners as those of the valves 243a, 243c and 243d in the step S3. After the flow rate of the $NH_3$ gas is adjusted by the MFC 241b, the $NH_3$ gas whose flow rate is adjusted is supplied into the buffer chamber 237 through the nozzle 249b. Simultaneously, the high frequency power is applied to the rod-shaped electrodes 269, 270 and 271. The $NH_3$ gas supplied into the buffer chamber 237 is excited into the plasma state (activated by the plasma), supplied into the process chamber 201 as active species $NH_3^*$, and exhausted through the exhaust pipe 231.

For example, a supply flow rate of the $NH_3$ gas adjusted by the MFC 241b may range from 100 sccm to 10,000 sccm, preferably from 1,000 sccm to 2,000 sccm. For example, the high frequency power applied to the rod-shaped electrodes 269, 270 and 271 may range from 50 W to 600 W. For example, the inner pressure of the process chamber 201 may range from 1 Pa to 500 Pa. By using the plasma, the $NH_3$ gas is activated even when the inner pressure of the process chamber 201 is relatively low as described above. A time duration of exposing (supplying) the active species obtained by plasma-exciting the $NH_3$ gas onto the wafer 200 (that is, a gas supply time) may range from 1 second to 180 seconds, preferably from 1 second to 60 seconds. Other processing conditions of the step S5 are the same as those of the step S3.

By supplying the $NH_3$ gas into the process chamber 201 according to the above-described processing conditions, the silicon-containing layer formed on the wafer 200 is plasma-nitrided. During the nitridation, Si—Cl bonds and Si—H bonds included in the silicon-containing layer are broken by the energy of the plasma-excited $NH_3$ gas. The chlorine (Cl) and hydrogen (H) separated from silicon (Si) are desorbed from the silicon-containing layer. The dangling bond of the silicon in the silicon-containing layer produced due to the separation of chlorine and hydrogen enables the bonding of silicon in the silicon-containing layer to nitrogen (N) in the $NH_3$ gas to form a Si—N bond. As the reaction of forming the Si—N bond progresses, the silicon-containing layer is changed (modified) into a layer containing silicon and nitrogen, i.e. a silicon nitride layer (SiN layer).

In order to modify the silicon-containing layer into the SiN layer, it is preferable that the $NH_3$ gas is plasma-excited and then supplied. When the $NH_3$ gas is supplied under a non-plasma atmosphere, the energy demanded to nitride the silicon-containing layer may be insufficient at the above-described temperature range. Therefore, it is difficult to fully separate chlorine or hydrogen from the silicon-containing layer or fully nitride the silicon-containing layer to increase the number of the Si—N bond.

After the silicon-containing layer is modified to the SiN layer, the valve 243b is closed to stop the supply of the $NH_3$ gas into the process chamber 201. The high frequency power applied to the rod-shaped electrodes 269, 270 and 271 is also stopped. The $NH_3$ gas and by-products remaining in the process chamber 201 are removed from the process chamber 201 according to the same sequence and conditions as those of the step S4 (step S6). The step S6 is optional and may be omitted.

While the $NH_3$ gas is exemplified as a nitriding agent in the present embodiment, instead of the $NH_3$ gas, a gas such as diazene ($N_2H_2$) gas, hydrazine ($N_2H_4$) gas and $N_3H_8$ gas may be used as the nitriding agent, that is, the nitrogen-containing gas excited by the plasma.

While the $N_2$ Gas is Exemplified as the Inert Gas in the Present Embodiment, a Rare Gas May be Used Instead of the $N_2$ Gas as the Inert Gas Similar to the Step S4.

Performing Predetermined Number of Times: S7

By performing the cycle wherein the steps S3, S4, S5 and S6 are performed non-simultaneously in order a predetermined number of times (n times), a SiN film of a predetermined composition and a predetermined thickness is formed on the wafer 200 (S7). It is preferable that the cycle is performed a plurality of times. That is, it is preferable that the SiN film of a desired thickness is formed by laminating SiN layers thinner than the desired thickness by performing the cycle a plurality of times until the desired thickness obtained.

Returning to Atmospheric Pressure Step: S8

After the film-forming step is performed, the $N_2$ gas serving as the inert gas is supplied into the process chamber 201 through each of the gas supply pipes 232c and 232d, and then is exhausted through the exhaust pipe 231. The process chamber 201 is thereby purged with the inert gas such that the gas or the reaction by-products remaining in the process chamber 201 are removed from the process chamber 201 (purging by inert gas). Thereafter, the inner atmosphere of the process chamber 201 is replaced with the inert gas (substitution by inert gas), and the inner pressure of the process chamber 201 is returned to the atmospheric pressure (S8).

Substrate Unloading Step: S9

Then, the seal cap 219 is lowered by the boat elevator 115 and the lower end of the manifold 209 is opened. The boat 217 with a plurality of processed wafers including the wafer 200 charged therein is unloaded out of the reaction tube 203 through the lower end of the manifold 209 (boat unloading step). After the boat 217 is unloaded, the shutter 219s is moved. The lower end of the manifold 209 is sealed by the shutter 219s through the O-ring 220c (shutter closing step). The plurality of the processed wafers including the wafer 200 are taken out of the reaction tube 203, and then discharged from the boat 217 (wafer discharging step). An empty boat 217 may be loaded back into the process chamber 201 after the wafer discharging step.

(3) Effects According to Present Embodiment

According to the present embodiment described above, it is possible to provide one or more of the following effects.
- (a) According to the present embodiment, by providing the tanks in which the gas such as the source gas is heated, it is possible to increase a pressure of the source gas supplied at about the room temperature by storing and heating the source gas in the tanks. Thereby, it is possible to increase a supply pressure on the upstream side of the MFC.
- (b) By providing two or more lines of the tank on the upstream side of the MFC, it is possible to implement a large flow rate MFC. Thereby, it is possible to supply a stable large flow rate of the gas to the process chamber by the large flow rate MFC.

First Modified Example

Figure 8:
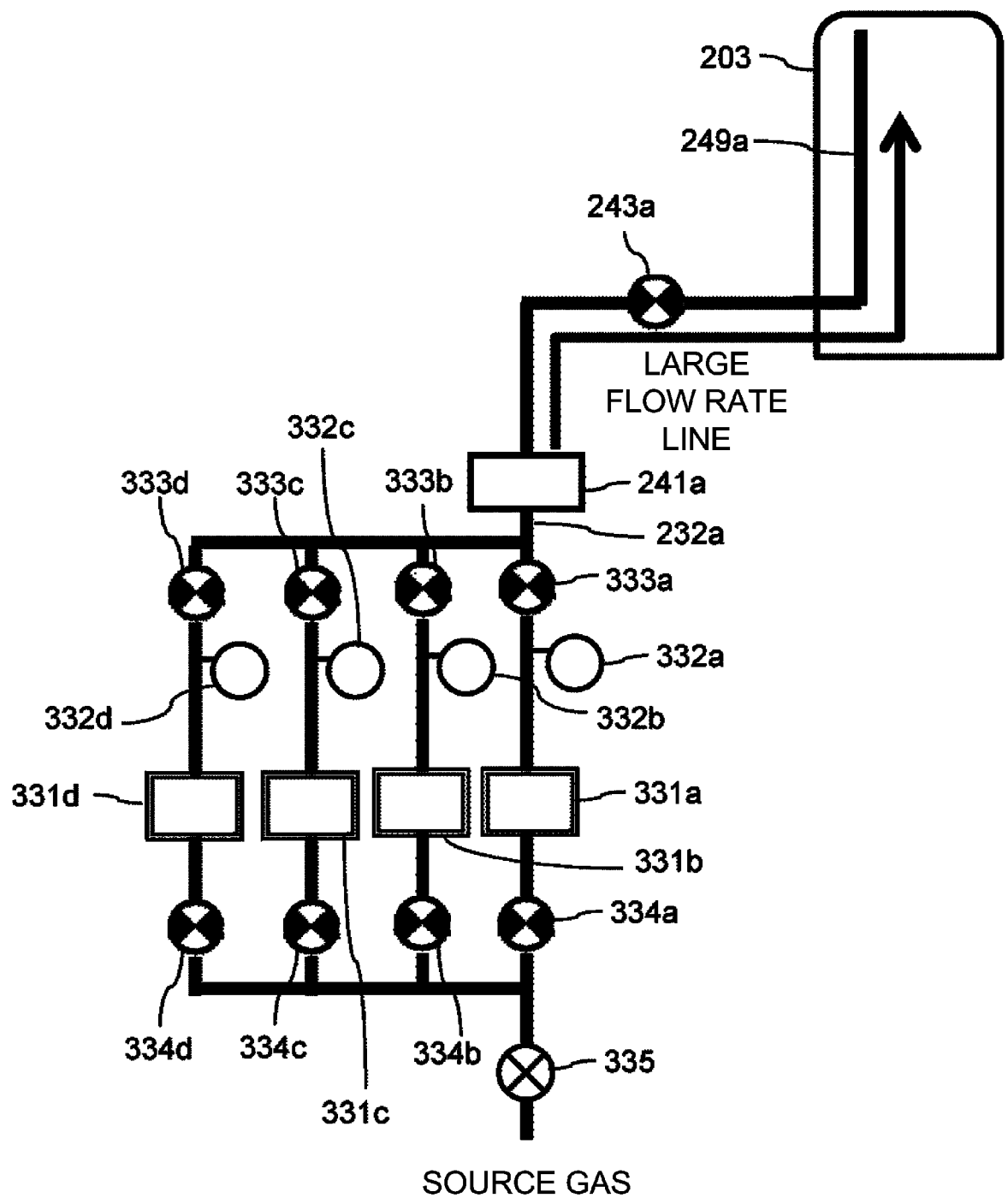
FIG. 8 schematically illustrates a first modified example of the source gas supply line of the substrate processing apparatus according to the embodiments described herein.

Hereinafter, a first modified example of the present embodiment will be described with reference to FIG. 8. In the first modified example, only portions different from those of the above-described embodiment will be described in detail below, and the description of portions the same as the above-described embodiment will be omitted.

According to the first modified example of the present embodiment, four tanks of the same volume are provided between the MFC 241a and the pressure regulator 335, and four source gas supply lines are arranged in parallel.

According to the first modified example, in addition to the first tank 331a and the second tank 331b, a third tank 331c and a fourth tank 331d are provided at the upstream side of the gas supply pipe 232a. Specifically, the third tank 331c, the fourth tank 331d, a third pressure meter 332c configured to measure an inner pressure of the third tank 331c, a fourth pressure meter 332d configured to measure an inner pressure of the fourth tank 331d, a third valve 333c configured to control the gas supply from the third tank 331c to the MFC 241a via the gas supply pipe 232a and a fourth valve 333d configured to control the gas supply from the fourth tank 331d to the MFC 241a via the gas supply pipe 232a are further provided at the upstream side of the MFC 241a. A third air-operated valve 334c configured to control the gas supply from the pressure regulator 335 to the third tank 331c is provided at an upstream side of the third tank 331c, and a fourth air-operated valve 334d configured to control the gas supply from the pressure regulator 335 to the fourth tank 331d is provided at an upstream side of the fourth tank 331d. As a result, even if the flow rate of the gas such as the sources gas is increased, it is possible to maintain the supply pressure on the upstream side of the MFC 241a at a high level by adopting the large flow rate MFC as the MFC 241a. In addition, since the tanks 331a through 331d of the same volume are used, the DCS gas is supplied in the same amount to the MFC 241a from each of the tanks 331a through 331d. Therefore, it is possible to stably supply the DCS gas.

Second Modified Example

Figure 9:
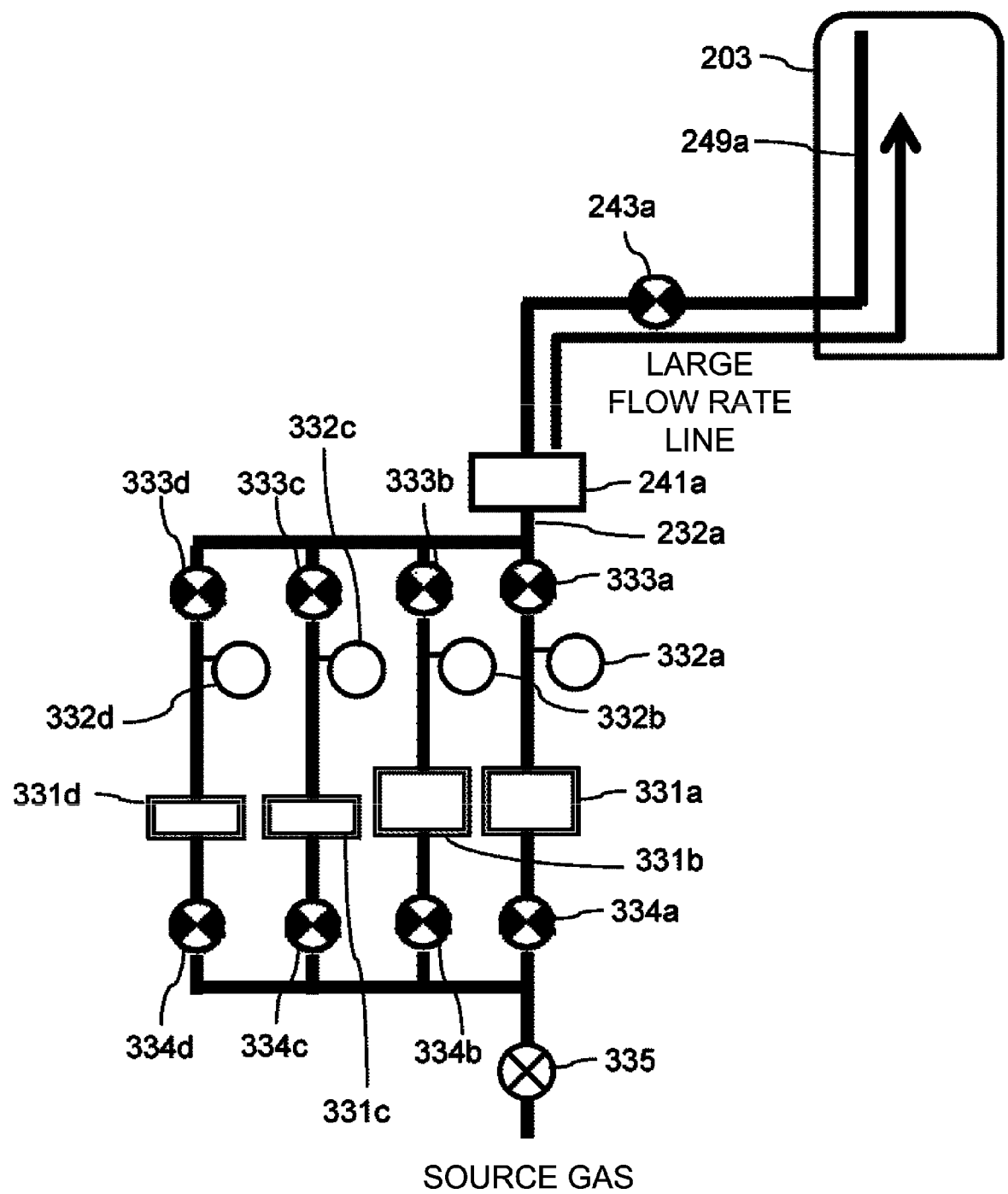
FIG. 9 schematically illustrates a second modified example of the source gas supply line of the substrate processing apparatus according to the embodiments described herein.

Hereinafter, a second modified example of the present embodiment will be described with reference to FIG. 9. In the second modified example, only portions different from those of the first modified example will be described in detail below, and the description of portions the same as the first modified example will be omitted.

According to the second modified example of the present embodiment, the volumes of the four tanks of the first modified are changed. That is, the four tanks include large-volume tanks and small-volume tanks. For example, the volumes of the third tank 331c and the fourth tank 331d are smaller than the volumes of the first tank 331a and the second tank 331b. As a result, when the substrate processing apparatus according to the embodiment is operated continuously for a longer time, it is possible to avoid a situation where the gas in the tanks may not be heated sufficiently. Therefore, it is possible to prevent problems caused by waiting for a heating time (that is, the time the gas in the tanks is sufficiently heated).

Other Embodiments

While the technique described herein is described by way of the above-described embodiment and the modified examples, the above-described technique is not limited thereto. The above-described technique may be modified in various ways without departing from the scope of the technique.

For example, the above-described embodiment is described by way of an example in which the reactive gas is supplied after the source gas is supplied. However, the above-described technique is not limited thereto. The above-described technique may also be applied when a supply order of the source gas and the reactive gas is changed. That is, the above-described technique may be applied when the source gas is supplied after the reactive gas is supplied. By changing the supply order of the gases, it is possible to change the quality or the composition of the film formed by performing the substrate processing.

For example, the above-described embodiment is described by way of an example in which the silicon nitride film (SiN film) on the wafer 200. However, the above-described technique is not limited thereto. For example, the above-described technique may also be applied to form, on the wafer 200, a silicon-based oxide film such as a silicon oxide film (SiO film), a silicon oxycarbide film (SiOC film), a silicon oxycarbonitride film (SiOCN film) and a silicon oxynitride film (SiON film). For example, the above-described technique may also be applied to form, on the wafer 200, a silicon-based nitride film such as a silicon carbonitride film (SiCN film), a silicon boronitride film (SiBN film) and a silicon boron carbonitride film (SiBCN film). An oxygen (O)-containing gas, a carbon (C)-containing gas such as $C_3H_6$, a nitrogen (N)-containing gas such as $NH_3$ and a boron (B)-containing gas such as $BCl_3$ may be used as the reactive gas to form the above-described films.

The above-described technique may also be applied to form, on the wafer 200, an oxide film (metal-based oxide film) or a nitride film (metal-based nitride film) containing a metal element such as titanium (Ti), zirconium (Zr), hafnium (Hf), tantalum (Ta), niobium (Nb), aluminum (Al), molybdenum (Mo) and tungsten (W). That is, the above-described technique may also be applied to form, on the wafer 200, a film such as a TiO film, a TiN film, a TiOC film, a TiOCN film, a TiON film, a TiBN film, a TiBCN film, a ZrO film, a ZrN film, a ZrOC film, a ZrOCN film, a ZrON film, a ZrBN film, a ZrBCN film, a HfO film, and a HfN film, a HfOC film, a HfOCN film, a HfON film, a HfBN film, a HfBCN film, a TaO film, a TaOC film, a TaOCN film, a TaON film, a TaBN film, a TaBCN film, a NbO film, a NbN film, a NbOC film, a NbOCN film, a NbON film, a NbBN film, a NbBCN film, an AlO film, an AN film, an AlOC film, an AlOCN film, an AlON film, an AlBN film, an AlBCN film, a MoO film, a MoN film, a MoOC film, a MoOCN film, a MoON film, a MoBN film, a MoBCN film, a WO film, a WN film, a WOC film, a WOCN film, a WON film, a WBN film and a WBCN film.

For example, various gases such as tetrakis(dimethylamino)titanium (Ti[N(CH$_3$)$_2$]$_4$, abbreviated as TDMAT) gas, tetrakis(ethylmethylamino)hafnium (Hf[N(C$_2$H$_5$)(CH$_3$)]$_4$, abbreviated as TEMAH) gas, tetrakis(ethylmethylamino) zirconium (Zr[N(C$_2$H$_5$)(CH$_3$)]$_4$, abbreviated as TEMAZ) gas, trimethylaluminum (Al(CH$_3$)$_3$, abbreviated as TMA) gas, titanium tetrachloride (TiCl$_4$) gas and hafnium tetrachloride (HfCl$_4$) gas may be used as the source gas to form the metal-based oxide film or the metal-based nitride film described above. As the reactive gas, the above-described reactive gas may be used.

That is, the above-described technique may also be applied to form a metalloid film containing a metalloid element or a metal-based film containing a metal element. The processing sequences and the processing conditions of the film-forming process of the metalloid film or the metal-based film may be substantially the same as those of the film-forming process according to the embodiment or the modified examples. Even when the above-described technique is applied to the film-forming process of the metalloid film or the metal-based film, it is possible to obtain the same effects as the above-described embodiment or the modified examples.

Recipes used in the film-forming process are preferably prepared individually according to the process contents and stored in the memory 121c via an electric communication line or the external memory 123. When starting various processes, the CPU 121a is configured to select an appropriate recipe among the recipes stored in the memory 121c according to the process contents. Thus, various films having different composition ratios, qualities and thicknesses may be formed in a reproducible manner by using a single substrate processing apparatus. In addition, since the burden on an operator of the substrate processing apparatus may be reduced, various processes may be performed quickly while avoiding a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the input/output device 122 of the substrate processing apparatus.

As described above, according to some embodiments in the present disclosure, it is possible to uniformly process the substrate.

What is claimed is:
1. A substrate processing apparatus comprising:
a process chamber in which a substrate is processed;
a first gas supply system configured to supply a first gas onto the substrate in the process chamber and comprising: a first tank and a second tank configured to store and heat the first gas therein, wherein volumes of the first tank and the second tank are equal to each other; and a third tank configured to store and heat the first gas therein, wherein a volume of the third tank is smaller than those of the first tank and the second tank; and
a controller configured to control the first gas supply system such that the first gas is supplied onto the substrate in the process chamber while switching among the first tank, the second tank, and the third tank.
2. The substrate processing apparatus of claim 1, wherein the first gas supply system further comprises:
a mass flow controller connected to the first tank, the second tank, and the third tank and configured to control a supply flow rate of the first gas supplied into the process chamber.
3. The substrate processing apparatus of claim 1, wherein the first gas supply system further comprises:
a valve and a pressure meter configured to control a supply of the first gas and provided at each of the first tank, the second tank, and the third tank,
wherein the controller is further configured to supply the first gas by controlling opening and closing of the valve and switching among the first tank, the second tank and the third tank based on pressure values measured by the pressure meter while supplying the first gas.
4. The substrate processing apparatus of claim 1, further comprising:
a second gas supply system configured to supply a second gas onto the substrate in the process chamber,
wherein the first gas comprises a source gas, and the second gas comprises a reactive gas.
5. The substrate processing apparatus of claim 4, further comprising:
a third gas supply system configured to supply a third gas onto the substrate in the process chamber,
wherein the third gas comprises an inert gas.
6. The substrate processing apparatus of claim 4, further comprising:
a plasma generator provided in the process chamber in a vertical direction and configured to activate the reactive gas by plasma.
7. The substrate processing apparatus of claim 6, wherein the plasma generator comprises:
a plurality of first rod-shaped electrodes connected to a high frequency power supply; and
a second rod-shaped electrode grounded.
8. The substrate processing apparatus of claim 7, wherein the plasma generator is further configured to activate the reactive gas by the plurality of first rod-shaped electrodes and the second rod-shaped electrode.
9. The substrate processing apparatus of claim 7, wherein the second rod-shaped electrode is interposed between the plurality of first rod-shaped electrodes.
10. A method of manufacturing a semiconductor device comprising:
(a) loading a substrate into a process chamber of a substrate processing apparatus comprising: the process chamber in which the substrate is processed; a first gas supply system configured to supply a first gas onto the substrate in the process chamber and comprising: a a first tank and a second tank configured to store the first gas therein, wherein volumes of the first tank and the second tank are equal to each other; a third tank configured to store and heat the first gas therein, wherein a volume of the third tank is smaller than those of the first tank and the second tank; and a second gas supply system configured to supply a second gas onto the substrate in the process chamber;

(b) supplying the first gas onto the substrate in the process chamber through the first gas supply system while switching among the first tank, the second tank, and the third tank; and (c) supplying the second gas onto the substrate in the process chamber through the second gas supply system.

11. The method of claim 10, wherein the substrate processing apparatus further comprises pressure meters configured to measure an inner pressure of each of the first tank, the second tank and the third tank, and wherein the first gas is supplied onto the substrate in the process chamber in (b) while switching among the first tank, the second tank, and the third tank plurality of tanks based on pressure values measured by the pressure meters.

12. The method of claim 10, wherein the substrate processing apparatus further comprises a plasma generator configured to activate the second gas by plasma, wherein the second gas activated by the plasma generator is supplied onto the substrate in the process chamber in (c).

13. A non-transitory computer-readable recording medium storing a program related to a substrate processing apparatus comprising: a process chamber in which a substrate is processed; a first gas supply system configured to supply a first gas onto the substrate in the process chamber and comprising: a first tank and a second tank configured to store the first gas therein, wherein volumes of the first tank and the second tank are equal to each other; and a third tank configured to store and heat the first gas therein, wherein a volume of the third tank is smaller than those of the first tank and the second tank; and a second gas supply system configured to supply a second gas onto the substrate in the process chamber, wherein the program causes, by a computer, the substrate processing apparatus to perform:

(a) loading the substrate into the process chamber of the substrate processing apparatus;

(b) supplying the first gas onto the substrate in the process chamber through the first gas supply system while switching among the first tank, the second tank, and the third tank; and (c) supplying the second gas onto the substrate in the process chamber through the second gas supply system.

14. The non-transitory computer-readable recording medium of claim 13, wherein the substrate processing apparatus further comprises pressure meters configured to measure an inner pressure of each of the first tank, the second tank, and the third tank, and wherein the first gas is supplied onto the substrate in the process chamber in (b) while switching among the first tank, the second tank, and the third tank based on pressure values measured by the pressure meters.

15. The non-transitory computer-readable recording medium of claim 13, wherein the substrate processing apparatus further comprises a plasma generator configured to activate the second gas by plasma, wherein the second gas activated by the plasma generator is supplied onto the substrate in the process chamber in (c).

* * * * *

UNITED STATES PATENT AND TRADEMARK OFFICE
CERTIFICATE OF CORRECTION

Page 1 of 1

PATENT NO. : 12,385,139 B2
APPLICATION NO. : 17/012867
DATED : August 12, 2025
INVENTOR(S) : Daisuke Hara et al.

It is certified that error appears in the above-identified patent and that said Letters Patent is hereby corrected as shown below:

In the Claims

Column 19, Lines 20 and 21, Claim 11, cancel the text "plurality of tanks"

Signed and Sealed this
Twenty-third Day of September, 2025

John A. Squires
*Director of the United States Patent and Trademark Office*